United States Patent [19]

Nakano et al.

[11] 4,291,394
[45] Sep. 22, 1981

[54] SEMICONDUCTOR MEMORY DEVICE HAVING FLIP-FLOP CIRCUITS

[75] Inventors: Masao Nakano; Tomio Nakano; Yoshihiro Takemae; Katsuhiko Kabashima, all of Kawasaki, Japan

[73] Assignee: Fujitsu Limited, Japan

[21] Appl. No.: 87,389

[22] Filed: Oct. 22, 1979

[30] Foreign Application Priority Data

Oct. 26, 1978 [JP] Japan .................................. 53/132049

[51] Int. Cl.³ ............................................ G11C 11/40
[52] U.S. Cl. ..................................... 365/206; 365/210; 365/154
[58] Field of Search ................ 365/154, 174, 182, 189, 365/205, 206, 210

[56] References Cited

U.S. PATENT DOCUMENTS 4,195,357   3/1980   Kuo et al. ........................... 365/210

Primary Examiner—Terrell W. Fears
Attorney, Agent, or Firm—Staas and Halsey

[57] ABSTRACT

A semiconductor memory device having flip-flop circuits, in which first and second bit lines are connected to each of the flip-flop circuits as a sense amplifier, the potential of the second bit line being opposite to the potential of the first bit line, and the first and second data bus lines cross perpendicularly to the first and second bit lines, respectively, the first and second dummy lines are arranged in parallel with the first and second data bus lines respectively, in order to prevent erroneous operation of an I/O amplifier connected to the first and second data bus lines.

3 Claims, 3 Drawing Figures

SEMICONDUCTOR MEMORY DEVICE HAVING FLIP-FLOP CIRCUITS

BACKGROUND OF THE INVENTION

(1) Field of the Invention

The present invention relates to a semiconductor memory device having flip-flop circuits, and more particularly to a semiconductor memory device having flip-flop circuits in which an erroneous operation occurs due to a noise induced in the conductors connected to the input terminals of the flip-flop circuits.

(2) The Prior Art

An example of the prior art semiconductor memory device using MOS FETs is illustrated in FIG. 1. In FIG. 1, the semiconductor memory device comprises sense amplifiers 31, 32, ..., 3N which read-out the information stored in memory elements and an input/output (I/O) amplifier 4. Each of the sense amplifiers 31, 32, ..., 3N and the I/O amplifier 4 consists of a flip-flop circuit. Each of the sense amplifiers 31, 32, ..., 3N is connected to a pair of bit lines 11, 21; 12, 22; ...; 1N, 2N, respectively. The I/O amplifier 4 is connected to a pair of data bus lines 51, 52.

When the sense amplifiers 31, 32, ..., 3N amplify the signals on the bit lines 11, 21; 12, 22; ... 1N, 2N in accordance with the read clock signal $\bar{\phi}R$, noise is induced in the data bus lines 51, 52 from the bit lines 11, 21; 12, 22; ... 1N, 2N due to the existence of the coupling capacitances $C_1, C_2, \ldots C_N$. It is assumed that the information to be read-out exists in the pair of bit lines 11, 21 but not in the pairs of bit lines 12, 22 through 1N, 2N. The value of the noise $\Delta VN_2$ induced in the data bus line 52 is represented by the equation (1) below.

$$\Delta VN_2 = - \frac{\sum_{k=1}^{N} C_k}{C_m + \sum_{k=1}^{N} C_k} \cdot \Delta V_{B2} \quad (1)$$

Here, $C_m$ is the capacitance between the data bus line 52 and ground and $\Delta V_{B2}$ is the variation of the voltage of bit line 22. The value of the noise $\Delta VN_1$ induced in the data bus line 51 is approximately equal to zero $$\Delta VN_1 \approx 0 \quad (2)$$

The input voltage $V_S$ applied to the I/O amplifier 4 is represented by the equation (3) below.

$$V_S = - \frac{C_B}{C_m + \sum_{k=1}^{N} C_k} \cdot \Delta V_{B1} \quad (3)$$

Here, $C_B$ is the capacitace between the bit line and the ground and $\Delta V_{B1}$ is the variation of the voltage of bit line 11.

In the case where the data of the cell to be read-out is the same as the data of the cells not to be read-out, the phase of the noise $\Delta VN_2$ of the equation (1) is the same as the phase of the voltage $V_S$ of the equation (3), and, accordingly, no erroneous operation of the I/O amplifier 4 is caused. In contrast, in the case where the data of the cell to be read-out is the opposite of the data of the cells not to be read-out, the phase of the noise $\Delta VN_2$ of the equation (1) is the reverse of the phase of the voltage $V_S$ of the equation (3), and, accordingly an erroneous operation of the I/O amplifier 4 is caused if the absolute value of the noise $\Delta VN_2$ is greater than the absolute value of the voltage $V_S$.

The above described operation of the circuit of FIG. 1 is illustrated by the wave forms I, II and III of FIG. 3. At first, when the precharge clock signal $\phi p$ is applied to the gates of the FETs connected to the bit lines 11 and 21 the potentials (H, L) of the bit lines 11 and 21 start to change so as to be equalized and to attain a high level as shown in the wave form I. Then, when the signal Xm is applied to the gate of the FET connected to the real cell $C_R$, the equalized potentials of the bit lines 11 and 21 become different. Then, when the read clock signal $\bar{\phi}R$ is applied to the sense amplifier 31, the sense amplifier 31 starts to operate so that the potential difference between the bit lines 11 and 21 becomes greater. Thus, the potentials of the bit lines 11 and 21 are brought to the low level (L) and the high level (H), respectively, as shown in the wave form I.

It is assumed that the changes of the potentials of the bit lines 12, 22 through 1N, 2N from which no stored information is to be read-out are the reverse of the bit lines 11, 21 as shown in the wave form II.

The process of the change of the potentials of the data bus lines 51 and 52 due to the effect of the noise induced from the bit lines is illustrated in the wave form III. Due to the existence of the noise $\Delta VN_2$ of equation (1), the potential of the data bus line 52 falls (F) as shown in the wave form III. Under these conditions, when the decoder signal $Y_1$ is applied to the FETs connected between the bit lines 11, 21 and the data bus lines 51, 52 and the data clock signal $\phi_D$ is applied to the I/O amplifier 4, the potential of the data bus line 51 remains high and the potential of the data bus line 52 becomes low. This potential distribution between the data bus lines 51 and 52 reversely corresponds to the potential distribution between the bit lines 11 and 21 in the wave form I. Accordingly, the potential distribution between the data bus lines 51 and 52 provides erroneous operation due to the induced noise.

The prior art semiconductor memory devices having flip-flop circuits are disclosed in, for example, U.S. Pat. No. 3,514,765 and thesis "The Design of MOS Dynamic RAMs" by R.C. Foss, 1979 IEEE International Solid-state Circuits Conference.

SUMMARY OF THE INVENTION

In order to solve the above explained problems of prior art semiconductor memory devices having flip-flop circuits, the present invention has as an object the provision of a dummy line which is arranged to cross the bit lines in parallel with the data bus lines.

The principal object of the present invention is to prevent the erroneous operation of a semiconductor memory device having flip-flop circuits due to the noise induced in the data bus and to ensure the correct reading-out of the stored information.

DESCRIPTION OF THE PREFERRED EMBODIMENT

Figure 1:
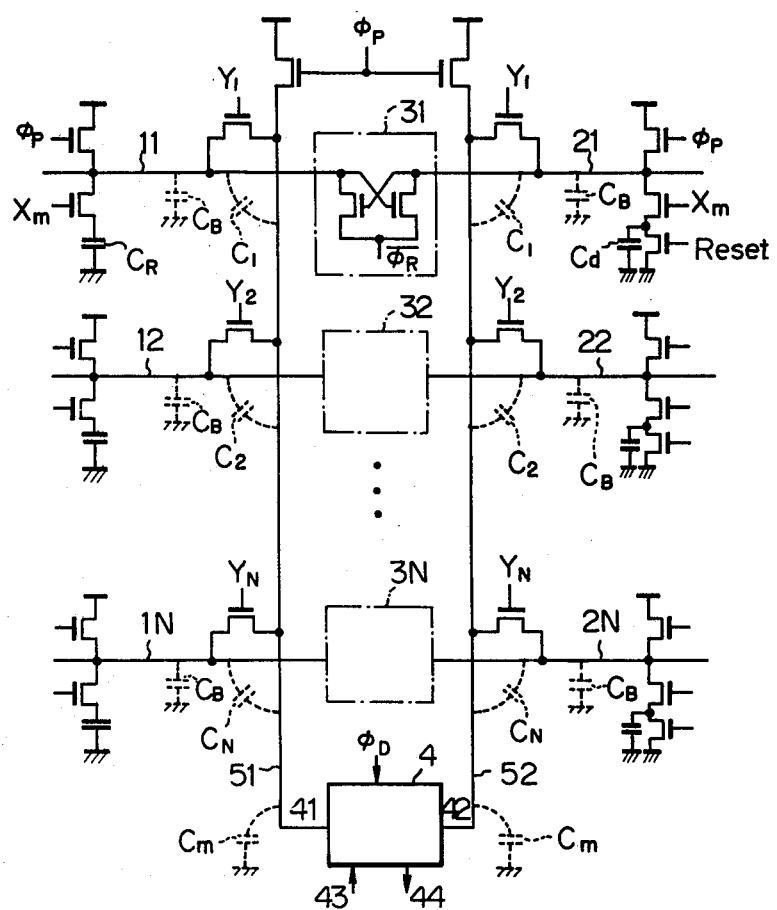
FIG. 1 is a circuit diagram of a prior art semiconductor memory device having flip-flop circuits.
Figure 2:
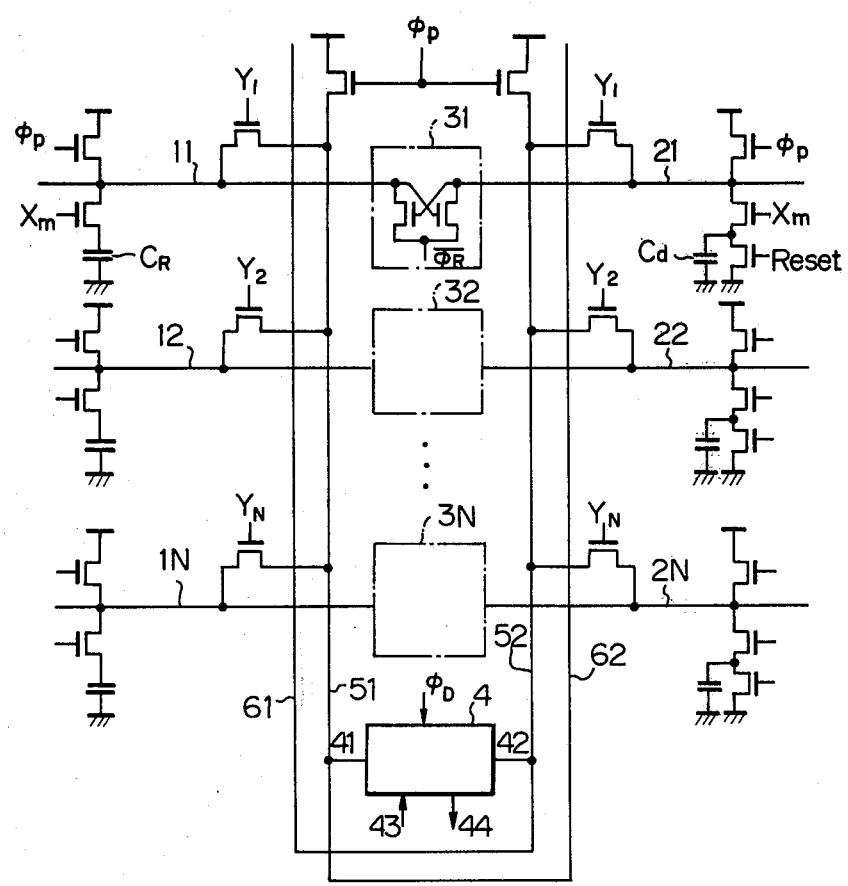
FIG. 2 is a circuit diagram of a semiconductor memory device having flip-flop circuits in accordance with an embodiment of the present invention.

In FIG. 2 a circuit diagram of a semiconductor memory device having flip-flop circuits in accordance with an embodiment of the present invention is illustrated. The sense amplifiers 31, 32, . . . , 3N are provided corresponding to the pairs of bit lines 11, 21; 12, 22; . . . , 1N, 2N. The terminals of the I/O amplifier 4 are connected to the data bus lines 51 and 52. A dummy line 61 is arranged adjacent to and in parallel with the data bus 51 crossing the bit lines 11, 12, . . ., 1N. An end of the dummy line 61 is connected to a terminal 42 of the I/O amplifier 4 to which the data bus line 52 is connected. Another dummy line 62 is arranged adjacent to and parallel with the data bus line 52 crossing the bit lines 21, 22, . . . , 2N. An end of the dummy line 62 is connected to the other terminal 41 of the I/O amplifier 4 to which the data bus line 51 is connected. Except for the addition of the dummy lines 61 and 62, the structure of the circuit of FIG. 2 is the same as that of FIG. 1.

As a modification of the arrangements of the dummy lines, it is possible to arrange the dummy lines 61 and 62 in parallel with the data bus lines 51 and 52 but not adjacent to the data bus lines 51 and 52, respectively. Also, it is possible to connect the dummy lines 61 and 62 to the data bus lines 52 and 51 at points other than the connecting points between the date bus lines 52, 51 and the I/O amplifier 4.

The operation of the circuit shown in FIG. 2 will now be explained. When the signal Xm is applied to the gate of the FET connected to the real cells $C_R$, the information stored in the real cells $C_R$ is transmitted to the bit line 11. This transmitted information is represented by a small voltage signal of for example 100 milli volts to 200 milli volts. Then, when the read clock signal $\phi R$, is applied to the sense amplifier 31, the small voltage signal is amplified by the sense amplifier 31 so that the potentials of the bit lines 11 and 21 attain the levels of 5 volts (power source voltage) and zero volts, respectively. At the same time, the noise $\Delta VN_2$, represented by equation (1) is induced in the data bus line 52 from the bit line through the coupling capacitance between the data bus line 52 and the bit lines 21, 22, . . . , 2N.

When the column decoder signal $Y_1$ is applied to the FETs connected between the bit lines 11, 21 and the data bus lines 51, 52, the signals on the bit line 11, 21 are transmitted to the data bus lines 51, 52, so that the signal $V_s$ represented by the equation (3) is established between the data buses 51 and 52.

If no dummy lines 61, 62 were provided, the total input voltage $V'_t$ to the I/O amplifier 4 would be as follows.

$$V'_t = V_s + (\Delta VN_1 - \Delta VN_2) \tag{4}$$

Accordingly, if the absolute value of $\Delta VN_2$ is greater than the absolute value of $V_s$, the signal $V_s$ will be cancelled by the noise $\Delta VN_2$ and the signal representing the noise $\Delta VN_2$ will be applied to the input of the I/O amplifier 4. This will cause erroneous operation of the I/O amplifier 4.

However, the dummy lines 61 and 62 are provided in the circuit of FIG. 2. Because of the presence of the dummy lines 61 and 62, the total input voltage $V_t$ to the I/O amplifier 4 is as follows.

$$V_t = V_s + (\Delta VN_1 - \Delta VN_2) + (\Delta VN_{2d} - \Delta VN_{1d}) \tag{5}$$

Here, $\Delta VN_{1d}$ and $\Delta VN_{2d}$ are the noises induced in the dummy lines 61 and 62, respectively. Since the noise $\Delta VN_1$ induced in the data bus 51 is equal to the noise $\Delta VN_{1d}$ induced in the dummy line 61 and the noise $\Delta VN_2$ induced in the date bus 52 is equal to the noise $\Delta VN_{2d}$ induced in the dummy line 62, the total input voltage $V_t$ to the I/O amplifier 4 becomes equal to $V_s$. That is:

$$V_t = V_s \tag{6}$$

Accordingly, the I/O amplifier 4 receives the correct input signal so that no erroneous operation of the I/O amplifier occurs.

When the data clock signal $\phi_D$ is applied to the I/O amplifier 4, the potential difference between the terminals 41 and 42 is amplified in the I/O amplifier 4, and an output signal is obtained at the output 44 of the I/O amplifier 4.

Figure 3:
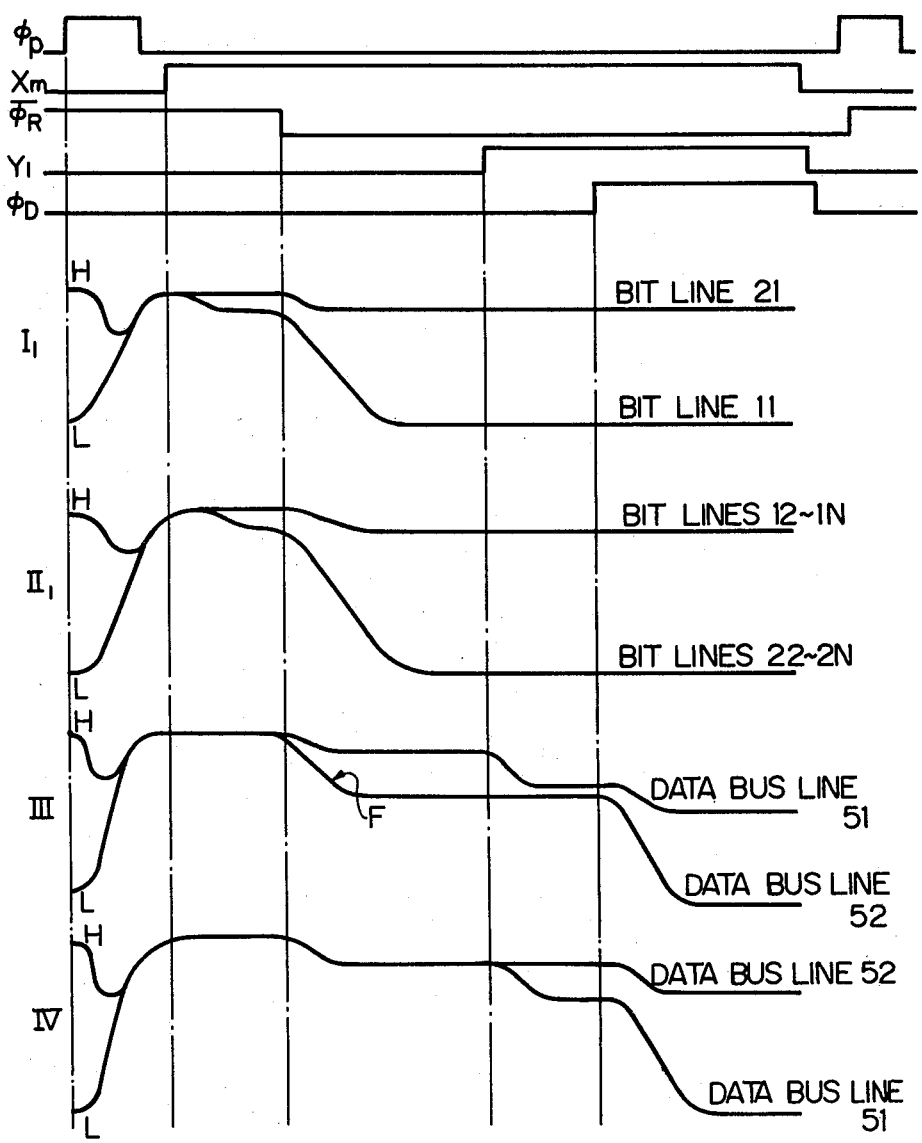
FIG. 3 illustrates wave forms for explaining the operations of the devices of FIG. 1 and FIG. 2.

The change of the potentials of the data bus lines 51 and 52 is illustrated in the wave form IV in FIG. 3. No fall of the potential of the data bus line 52 due to the noise $\Delta VN_2$, such as "F" in the wave form III, occurs in the wave form IV. Accordingly, the potential distribution between the data bus lines 51 and 52 correctly corresponds to the potential distribution between the bit lines 11 and 21 in the wave form I. This shows the correct operation of the circuit of FIG. 2.

What is claimed is:

1. A semiconductor memory device having flip-flop circuits, comprising:

a first bit lines arranged on one side of the flip-flop circuits;

second bit lines arranged on the other side of said flip-flop circuits, the potential of the second bit lines being opposite to the potential of the first bit lines;

a first data bus line operatively connected to and crossing perpendicularly to said first bit lines;

a second data bus line operatively connected to and crossing perpendicularly to said second bit lines;

a first dummy line arranged adjacent to and in parallel with said first data bus line and connected to said second data bus line; and a second dummy line arranged adjacent to and in parallel with said second data bus line and connected to said first data bus line, whereby noise generated by the coupling between said first and second bit lines and said first and second data bus lines is cancelled.

2. A semiconductor memory device, comprising:

a plurality of flip-flop circuits;

first bit lines connected to each of said plurality of flip-flop circuits;

second bit lines connected to each of said plurality of flip-flop circuits, wherein the potential of each of said second bit lines is opposite to the potential of each of said first bit lines;

a first data bus line, operatively connected to each of said first bit lines;

a second data bus line, operatively connected to each of said second bit lines;

a first dummy line parallel to said first data bus line and operatively connected to said second data bus line at a first node;

a second dummy line parallel to said second data bus line and operatively connected to said first data bus line at a second node; and an input/output amplifier circuit operatively connected between said first and second nodes, whereby said first and second dummy lines substantially reduce the erroneous operation of the input/output amplifier circuit due to noise.

3. A semiconductor memory device as set forth in claim 2, further comprising:

a bit signal generator, operatively connected to said first and second bit lines, for generating a bit signal;

a column decoder signal generator for generating a column decoder signal;

a plurality of FETs operatively connected to said column decoder signal generator and operatively connected between said first bit line, and said first data bus lines, and between said second bit line, and said second data bus lines, said FETs receiving the column decoder signal and said FETs applying said bit signal from said first and second bit lines to said first and second data bus lines in dependence upon the column decoder signal.

* * * * *

UNITED STATES PATENT AND TRADEMARK OFFICE
CERTIFICATE OF CORRECTION

Page 1 of 2

PATENT NO. : 4,291,394
DATED : September 22, 1981
INVENTOR(S) : Nakano et al.

It is certified that error appears in the above—identified patent and that said Letters Patent is hereby corrected as shown below:

Front page, [73] Assignee, after "Limited," insert
-- Kawasaki-shi --.

Column 1, line 13, change "the" to read -- Description of the --;

line 26, after "..." insert -- ; --;

line 29, after "..." insert -- ; --;

line 30, after "..." insert -- , --;

line 44, after "zero" insert -- . --;

line 55, change "capacitace" to -- capacitance --;

line 67, after "accordingly" insert -- , --.

Column 2, line 42, change the words "the prior" to -- Prior --.

Column 3, line 8, change "...," to -- ...; --;

line 28, change "date" to -- data --;

line 35, after "of" insert -- , --; and after "example" insert -- , --;

line 41, after "$\Delta VN_2$" delete ",".

Column 4, line 7, change "date" to -- data --;

line 34, delete "a".

UNITED STATES PATENT AND TRADEMARK OFFICE
CERTIFICATE OF CORRECTION

PATENT NO. : 4,291,394

DATED : September 22, 1981

INVENTOR(S) : Nakano et al.

It is certified that error appears in the above—identified patent and that said Letters Patent is hereby corrected as shown below:

Column 6, line 5, delete " , ";

line 6, delete the second occurrence of the comma " , " and change both words in the sentence from "lines" to -- line --;

line 7, change "lines" to -- line --.

Signed and Sealed this

Second Day of March 1982

[SEAL]

Attest:

Attesting Officer

GERALD J. MOSSINGHOFF

Commissioner of Patents and Trademarks